(12) United States Patent
Lee et al.

(10) Patent No.: US 6,844,569 B1
(45) Date of Patent: Jan. 18, 2005

(54) FABRICATION METHOD OF NITRIDE-BASED SEMICONDUCTORS AND NITRIDE-BASED SEMICONDUCTOR FABRICATED THEREBY

(75) Inventors: Kyu Han Lee, Daejeon (KR); Sun Woon Kim, Kyungki-do (KR); Je Won Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/831,190

(22) Filed: Apr. 26, 2004

(30) Foreign Application Priority Data

Dec. 20, 2003 (KR) .............................. 10-2003-0094302

(51) Int. Cl.[7] .............................................. H01L 33/00
(52) U.S. Cl. .......................... 257/79; 257/94; 257/200; 257/103; 257/96; 257/97; 257/99; 257/89; 438/46; 438/47
(58) Field of Search .............................. 257/79, 94, 89, 257/200, 103, 96, 97, 99; 438/46, 47

(56) References Cited

U.S. PATENT DOCUMENTS

| | | | | |
|---|---|---|---|---|
| 3,941,647 A | * | 3/1976 | Druminski | 117/90 |
| 5,952,681 A | * | 9/1999 | Chen | 257/89 |
| 2003/0057444 A1 | * | 3/2003 | Niki et al. | 257/200 |
| 2003/0189215 A1 | * | 10/2003 | Lee et al. | 257/94 |

\* cited by examiner

Primary Examiner—Caridad Everhart
Assistant Examiner—Victor V Yevsikov
(74) Attorney, Agent, or Firm—Lowe Hauptman Gilman & Berner, LLP

(57) ABSTRACT

The present invention relates to a fabrication method of nitride-based semiconductors and a nitride-based semiconductor fabricated thereby. In the fabrication method of the invention, a self-organizing metal layer is formed on a sapphire substrate. The sapphire substrate having the self-organizing metal layer is heated so that self-organizing metal coalesces into nanoscale clusters to irregularly expose an upper surface of the sapphire substrate. Exposed portions of the sapphire substrate is plasma etched using the self-organized metal clusters as a mask to form a nanoscale uneven structure on the sapphire substrate. A resultant structure is wet etched to remove the self-organized metal clusters. The nanoscale uneven structure formed on the sapphire substrate decreases the stress and resultant dislocation between the sapphire substrate and a nitride-based semiconductor layer as well as increases the quantum efficiency between the same.

21 Claims, 5 Drawing Sheets

FABRICATION METHOD OF NITRIDE-BASED SEMICONDUCTORS AND NITRIDE-BASED SEMICONDUCTOR FABRICATED THEREBY

BACKGROUND OF THE INVENTION

1. Field of the Invention

The present invention relates to a nitride-based semiconductor. In particular, the present invention relates to a fabrication method of nitride-based semiconductors capable of forming a nanoscale uneven structure on a sapphire substrate to decrease the stress and resultant dislocation between the sapphire substrate and a nitride-based semiconductor layer while increasing the quantum efficiency between the same. The invention also relates to a nitride-based semiconductor fabricated according to the above fabrication method of nitride-based semiconductors.

2. Description of the Related Art

A Light Emitting Diode (LED) basically consists of a junction of p- and n-doped semiconductor layers formed on a sapphire substrate as a kind of optoelectric device. When applied with electric current, the electron-hole combination in the LED converts energy corresponding to its band gap into light.

The semiconductor layers of the LED a re obtained by growing Gallium Nitride (GaN) single crystalline thin films on a heterogeneous substrate of sapphire, SiC, oxide or carbide via Metal-Organic Chemical Vapor Deposition (MOCVD) or Molecular Beam Epitaxy (MBE). However, because the substrate material such as sapphire is not identical with GaN in lattice constant and thermal expansion coefficient, high quality nitride single crystal is hardly grown on the substrate.

Two stage heteroepitaxy using a low temperature nucleation layer is adopted in order to solve this problem. However, a nitride layer grown in this solution contains crystal defects up to about $10^9$ to $10^{10}$ cm$^{-2}$.

Crystal defects deteriorate properties of resultant nitride-based semiconductors. Thus, several techniques such as Epitaxial Lateral Overgrowth (ELOG) are developed in order to reduce the crystal defects. A patterned substrate is also used to solve this problem.

However, these techniques have drawbacks in that excessive efforts are needed for the growth of LEDs since lateral growth takes a long time. Also, another problem is observed that crystal defect density is low only in wing regions.

Furthermore, because a substrate is patterned with a microscale-patterned mask, the pattern size of the substrate cannot be made smaller than the magnitude of the mask pattern. That is, when formed on substrates, patterns by conventional method are sized larger than a predetermined value, which in turn maintain crystal defect density at predetermined levels or more.

SUMMARY OF THE INVENTION

The present invention has been made to solve the foregoing problems of the prior art.

It is therefore an object of the present invention to provide a fabrication method of nitride-based semiconductors capable of forming a nanoscale uneven structure on a sapphire substrate to decrease the stress and resultant dislocation between the sapphire substrate and a nitride-based semiconductor layer while increasing the quantum efficiency between the same.

It is another object of the present invention to provide a nitride-based semiconductor fabricated according to the above fabrication method of nitride-based semiconductors.

According to an aspect of the invention for realizing the object, there is provided a fabrication method of nitride-based semiconductors comprising the following steps of:

(a) forming a self-organizing metal layer on a sapphire substrate;

(b) heating the sapphire substrate having the self-organizing metal layer so that self-organizing metal coalesces into nanoscale clusters to irregularly expose an upper surface of the sapphire substrate;

(c) plasma etching exposed portions of the sapphire substrate using the self-organized metal clusters as a mask to form a nanoscale uneven structure on the sapphire substrate; and (d) wet etching a resultant structure to remove the self-organized metal clusters.

In the fabrication method of nitride-based semiconductors of the invention, the step (a) forms the self-organizing metal layer preferably at a thickness of about 10 to 200 nm, and more preferably at a thickness of about 30 to 100 nm.

In the fabrication method of nitride-based semiconductors of the invention, the step (a) forms the self-organizing metal layer via vapor deposition.

Preferably, the vapor deposition is carried out via electron beam evaporation which generates electron beams at a voltage of about 5 kV and a discharge current of about 2 mA between a filament and a furnace in an electron beam pocket for a time period of about 5 to 10 minutes.

In the fabrication method of nitride-based semiconductors of the invention, the self-organizing metal layer is made of preferably at least one selected from a group including Pt, Au, Cr and alloys thereof.

In the fabrication method of nitride-based semiconductors of the invention, the heating step (b) is carried out preferably at a temperature range of about 500 to 100° C. in nitrogen atmosphere for about 2 to 10 mins., and more preferably at a temperature range of 700 to 1000° C. in nitrogen atmosphere for about 7 to 10 mins.

In the fabrication method of nitride-based semiconductors of the invention, the etching step (c) is carried out via Inductive Coupled Plasma-Reactive Ion Etching (ICP-RIE).

Preferably, the ICP-RIE is carried out at a high frequency power of about 50 to 100W and a DC bias of about 100 to 300V under a pressure of about 1 to 100 mmTorr for about 5 to 20 min. while injecting HBr or $BCl_3$ at a flow rate of about 1 to 200 cc per min.

In the fabrication method of nitride-based semiconductors of the invention, the etching step (c) forms irregular-shaped pores in the exposed portions on the sapphire substrate, the pores preferably having a width of about 50 to 500 nm and a depth of about 3 to 50 nm.

More preferably, the pores have a width of about 50 to 500 nm and a depth of about 5 to 20 nm.

In the fabrication method of nitride-based semiconductors of the invention, the wet etching step (d) comprises: immersing the etched sapphire substrate into aqua regia and heating the aqua regia containing the sapphire substrate at a temperature of about 80 to 9° C. for about 30 secs. to 2 mins.

The fabrication method of nitride-based semiconductors of the invention may further comprise the step of forming a nitride layer on the sapphire substrate after the wet etching step (d).

In the fabrication method of nitride-based semiconductors of the invention, the sapphire substrate is replaced by one selected from a group including a SiC substrate, an oxide substrate and a carbide substrate.

According to another aspect of the invention for realizing the object, there is provided a nitride-based semiconductor comprising: a sapphire substrate; a nitride nucleation layer, an n-doped GaN layer, an activation layer and a p-doped GaN layer formed in their order on the sapphire substrate; and a nanoscale uneven structure formed on the sapphire substrate according to the above-described method of the invention.

In the nitride-based semiconductor of the invention, the nanoscale uneven structure includes irregular-shaped pores preferably having a width of about 50 to 500 nm and a depth of about 3 to 50 nm. More preferably, the irregular-shaped pores have a width of about 50 to 500 nm and a depth of about 5 to 20 nm.

In the nitride-based semiconductor of the invention, the sapphire substrate is replaced by one selected from a group including a SiC substrate, an oxide substrate and a carbide substrate.

According to further another aspect of the invention for realizing the object, there is provided a nitride-based semiconductor for use with a light emitting diode comprising: a sapphire substrate; a nitride nucleation layer, an n-doped GaN layer, an activation layer and a p-doped GaN layer formed in their order on the sapphire substrate; and an uneven structure of irregular-shaped pores formed on the sapphire substrate, wherein the pores have a width of about 50 to 500 nm and a depth of about 3 to 50 nm.

In the nitride-based semiconductor of the invention, the ores preferably have a width of about 50 to 500 nm and a depth of about 5 to 20 nm.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The present invention proposes to form a nanoscale uneven structure on a sapphire substrate so that the nanoscale roughened sapphire substrate can be utilized in fabrication of nitride-based semiconductors. The nanoscale uneven structure on the sapphire substrate has an effect on GaN nucleation in a GaN-growing process to decrease crystal defects of GaN compound formed on the sapphire substrate. In detail, this restrains GaN growth around pores of the sapphire substrate but accelerates GaN nucleation around projections of the sapphire substrate so as to decrease any defects or faults in the interference between the sapphire substrate and GaN nuclei.

Referring to total reflection conditions, reflection angle is determined by the index of reflection between a sapphire substrate and air or GaN compound and air. If reflection angle is smaller than critical angle, light cannot escape out of a device. The invention overcomes this problem by means of a nanoscale uneven structure formed on the sapphire substrate. That is, the nanoscale uneven structure of the invention increases the quantum efficiency.

Furthermore, the nanoscale uneven structure also decreases the internal stress and resultant dislocation between the sapphire substrate and GaN compound originated from their lattice constant mismatch, thereby improving the reliability of nitride-based semiconductors and LEDs using the same.

Now the invention will be explained with reference to FIGS. 1 to 7, which are stepwise sectional views illustrating a fabrication method of nitride-based semiconductors according to a preferred embodiment of the invention.

(A) Forming Self-Organizing Metal Layer on Sapphire Substrate

Figure 1:
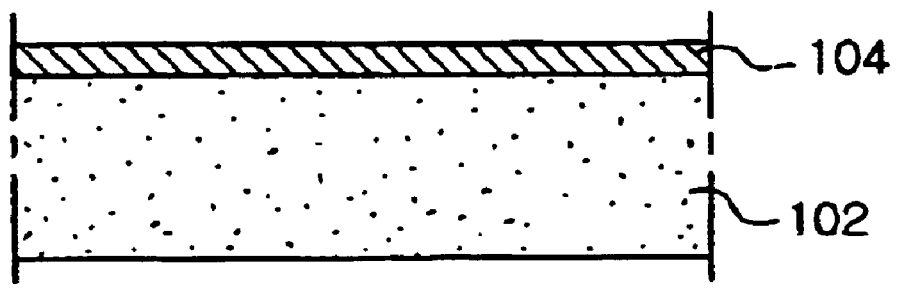
FIGS. 1 to 7 are stepwise sectional views illustrating a fabrication method of nitride-based semiconductors according to the invention.

A predetermined magnitude of sapphire substrate 102 is prepared, and then loaded into a reactor capable of implementing a desired operation. Then, a self-organizing metal is coated on the sapphire substrate 102 to form a predetermined thickness of a self-organizing metal layer 104 as shown in FIG. 1.

Examples of self-organizing metal adopted in this step may include Pt, Au, Cr and alloys thereof. In this step, the self-organizing metal layer 104 on the sapphire substrate 102 is made of at least one of these example metals.

In this case, the self-organizing metal is vapor deposited on the sapphire substrate 102 to form the self-organizing metal layer 104. Preferably, the vapor deposition is carried out via electron beam evaporation, which generates electron beams at a voltage of about 5 kV and a discharge current of about 2 mA between a filament and a furnace in an electron beam pocket for about 5 to 10 minutes.

This process forms the self-organizing metal layer 104 to a thickness of about 10 to 200 nm as a result. Preferably, the self-organizing metal layer 104 is formed at a thickness of about 30 to 100 nm.

Alternatively, the sapphire substrate 102 adopted in the fabrication method of nitride-based semiconductors of the invention may be replaced by one of the group including a SiC substrate, an oxide substrate and a carbide substrate.

(B) Coalescing Self-Organizing Metal

A resultant structure of the step (A), that is, the sapphire substrate 102 coated with the self-organizing metal layer 104 is heated according to predetermined process conditions. This heating step is carried out at a temperature range of 500 to 1000° C. in nitrogen atmosphere for about 2 to 10 mins., preferably at a temperature range of 700 to 1000° C. in nitrogen atmosphere for about 7 to 10 mins.

Figure 2:
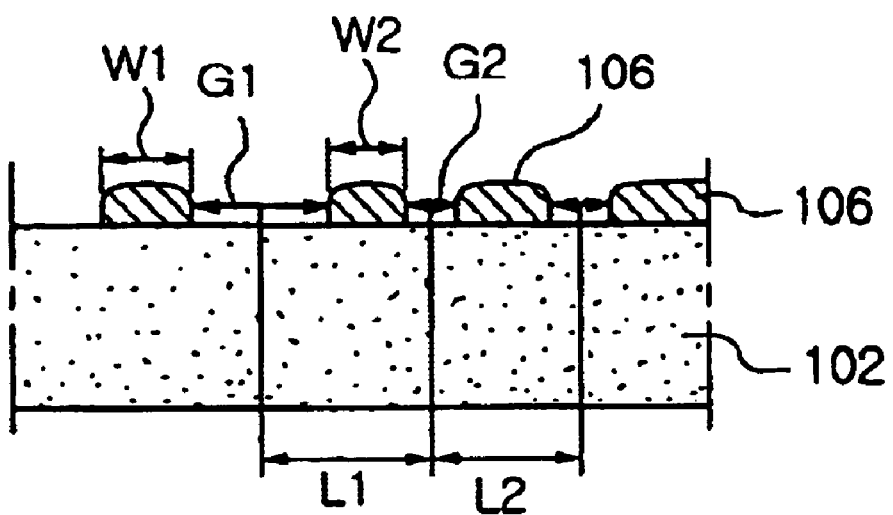

Then, the self-organizing metal layer 104 irregularly coalesces to form irregular-shaped self-organized metal clusters 106 on the sapphire substrate 102 partially exposing the sapphire substrate 102 as shown in FIG. 2.

The self-organized metal clusters 106 have diameters or widths W1 and W2 and gaps G1 and G2 between adjacent ones of the clusters which are different from one another as can be observed from cross sections of the clusters 106. Preferably, the gaps G1 and G2 are about 50 to 500 nm. Also, lengths L1 and L2 between centers of the gaps G1 and G2 are dependent mainly upon the widths W1 and W2 of the clusters 106. The lengths L1 and L2 are about 100 to 1000 nm, and preferably about 100 to 300 nm.

The self-organized metal clusters 106 may be formed into various morphologies, which can be determined according to self-organizing metal type in use, metal contents in case of alloy, heating conditions and etc.

(C) Etching Sapphire Substrate

Figure 3:
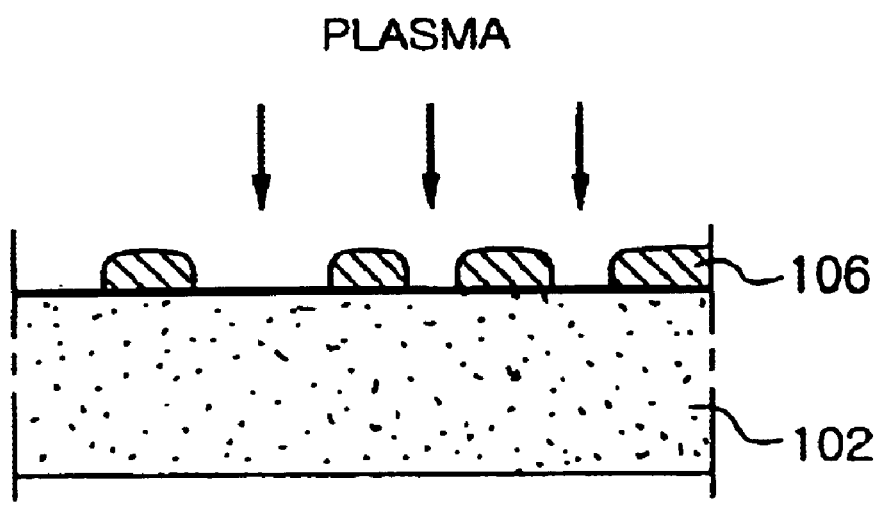

A resultant structure of the step (B) or the sapphire substrate 102 having the self-organized metal clusters 106 thereon is plasma etched as shown in FIG. 3.

This etching step as shown in FIG. 3 is carried out via Inductive Coupled Plasma-Reactive Ion Etching (ICP-RIE).

Preferably, this etching step is carried out at a high frequency power of about 50 to 100W and a DC bias of about 100 to 300V under a pressure of about 1 to 100 mmTorr for about 5 to 20 min. while injecting HBr or $BCl_3$ at a flow rate of about 1 to 200 cc per min.

Figure 4:
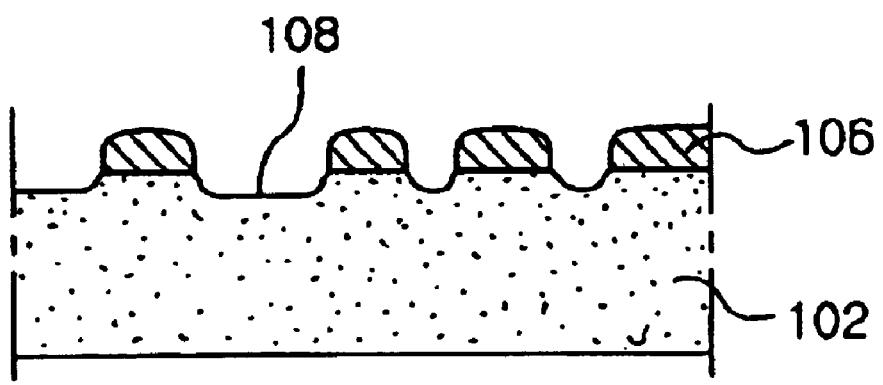

Then, the self-organized metal clusters 106 function as a mask so that the exposed portions of the sapphire substrate 102, in which the self-organized metal clusters 106 are not formed, are selectively etched to form a number of pores 108 with irregular magnitudes as shown in FIG. 4.

This etching step can form the irregular shaped pores 108 in the exposed surface portions of the sapphire substrate 102, in which the pores 108 have a width of about 50 to 500 nm and a depth of about 3 to 50 nm, and preferably a width of about 50 to 500 nm and a depth of about 5 to 20 nm. The widths of the pores 108 are dependent mainly upon the gaps G1 and G2 of the clusters 106 obtained in the coalescing step (B), and the depths of the ores 108 can be controlled by properly adjusting etching conditions.

(D) Removing Self-Organized Metal Clusters

Next wet etching is carried out to remove the self-organized metal clusters 106 from the surface of the sapphire substrate 102. This wet etching step immerses the plasma etched sapphire substrate 108 into aqua regia and heats the aqua regia containing the sapphire substrate 108 at a temperature of about 80 to 90° C., preferably at 85° C., for about 30 secs. to 2 mins. Aqua regia is a mixed solution of thick HCl and thick $HNO_3$, with a preferable mixing ratio of about 3:1.

Figure 5:
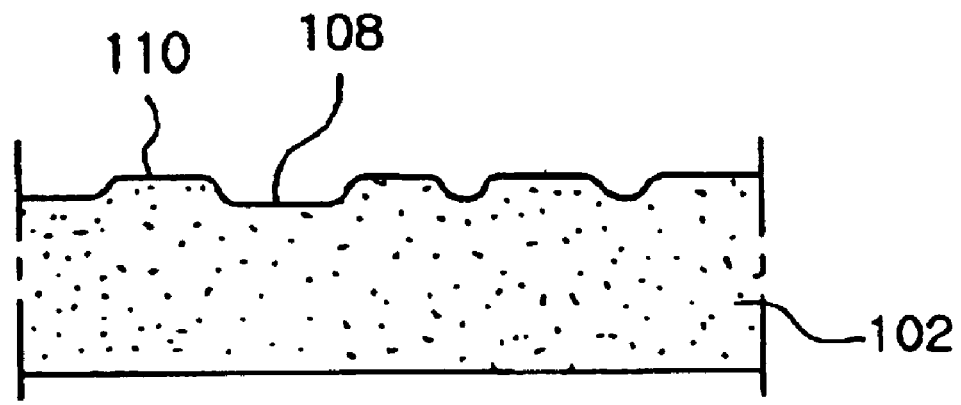

This process removes the self-organized metal clusters 106 from the sapphire 108 to form pillars or projections 110 together with the pores 108 on the sapphire substrate 102, as shown in FIG. 5, thereby realizing a nanoscale uneven structure which is pursued by the invention. In this case, the widths or diameters of the projections 110 are determined mainly by the gaps G1 and G2 of the self-organized metal clusters 106 and the lengths L1 and L2 between the gap centers.

(E) Forming Nitride Layer On Sapphire Substrate

Figure 6:
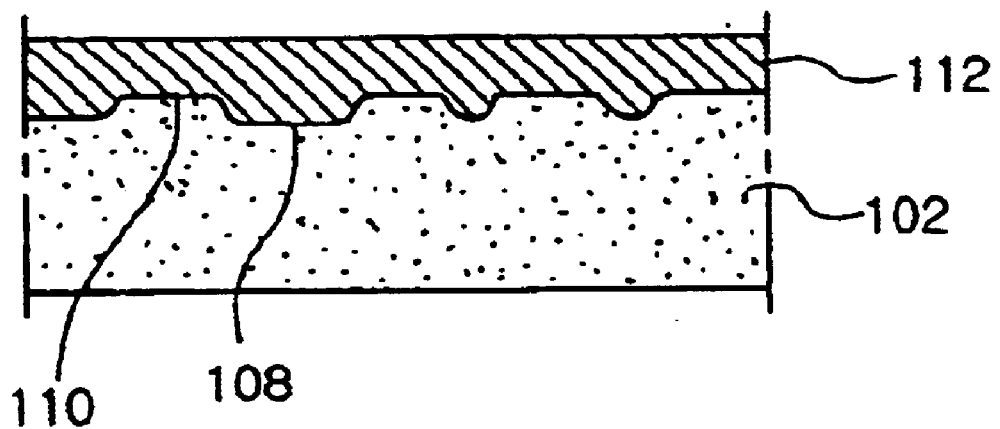

As shown in FIG. 6, a nucleation layer 112 made of nitride, more particularly, GaN compound is formed or grown on the sapphire substrate 102 having the microscale uneven structure of the pores 108 and the projections 110. The GaN nucleation layer 112 is formed typically at a thickness of 0.1 µm or less.

The nanoscale uneven structure of the pores 108 and the projections 110 on the sapphire substrate 102 reduces the internal stress or dislocation originated from the lattice constant mismatch between the sapphire substrate 102 and the GaN nucleation layer 112 so that the GaN nucleation layer 112 can be formed more reliably on the sapphire substrate 102.

Figure 7:
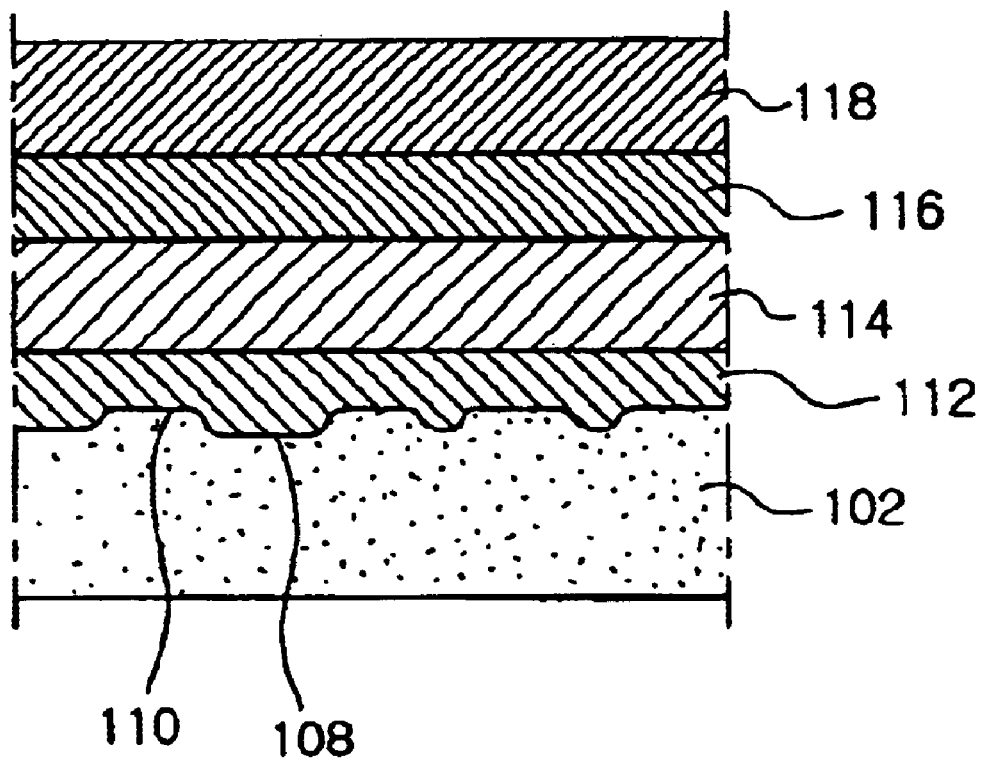

Next an n-doped GaN layer 114, an activation region 116 and a p-doped GaN layer 118 are formed in their order on the GaN nucleation layer 112 as shown in FIG. 7 to complete a nitride-based semiconductor 100 of the invention.

Since the n-doped GaN layer 114, the activation region 116 and the p-doped GaN layer 118 are formed according to typical techniques known in the art, they will not be described further.

Figure 8:
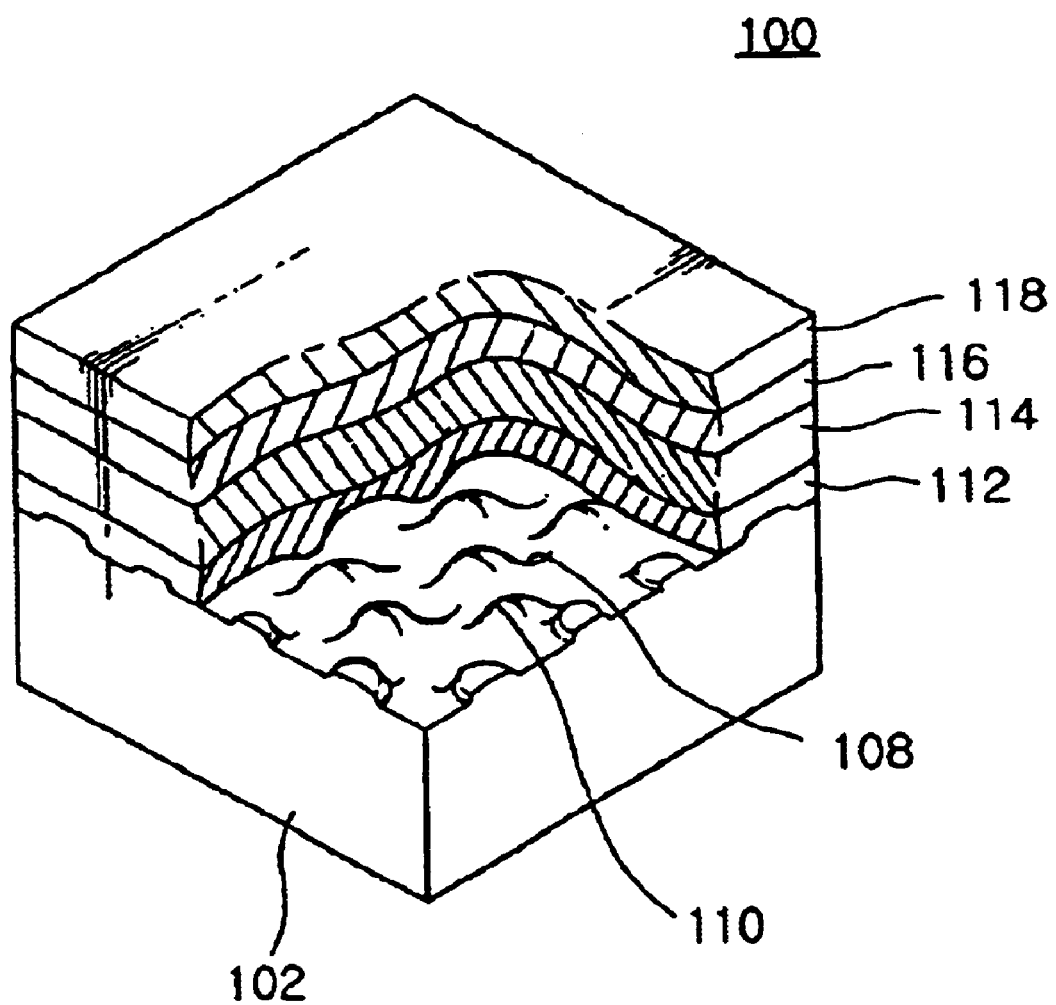
FIG. 8 is a partially broken perspective view of a nitride-based semiconductor fabricated according to the fabrication method of the invention.

FIG. 8 is a partially broken perspective view of a nitride-based semiconductor fabricated according to the fabrication method of the invention.

Referring to FIG. 8, a nitride-based semiconductor 100 of the invention includes a sapphire substrate 102 and a plurality of nitride layers 112 to 118 for example of GaN grown on a sapphire substrate 102. The nitride layers include a GaN nucleation layer 112 formed on the sapphire substrate 102, an n-doped GaN semiconductor layer 114 formed on the GaN nucleation layer 112, an activation region 116 on the n-doped GaN semiconductor layer 114 and a p-doped GaN semiconductor layer 118 on the activation region 116.

The sapphire substrate 102 has a nanoscale uneven structure on its upper surface which includes pores 108 and projections 110. The pores 108 are formed into an irregular shape with a width of about 50 to 500 nm and a depth of about 3 to 50 nm, and preferably, a depth of about 5 to 20 nm.

The nanoscale uneven structure of the pores 108 and the projections 110 on the sapphire substrate 102 reduces the stress and dislocation in the nitride layers 112 to 118, in particular, in the GaN nucleation layer 112 on the sapphire substrate 102. As a result, the nitride layers 112 to 118 can be formed or grown readily and stably.

The nanoscale uneven structure also reduces total reflection between the sapphire substrate 102 and the nitride layers 112 to 118 to advantageously improve the quantum efficiency.

Alternatively, the sapphire substrate 102 adopted in the nitride-based semiconductor 100 of the invention may be replaced by one of the group including a SiC substrate, an oxide substrate and a carbide substrate.

As set forth above, according to the fabrication method of nitride-based semiconductors of the invention and the nitride-based semiconductor fabricated thereby, the nanoscale uneven structure formed on the sapphire substrate surface has an effect on the nucleation of GaN, which grows on the sapphire substrate, to reduce defects or faults occurring in the interference between the sapphire surface and GaN nuclei.

The nanoscale uneven structure on the sapphire substrate also improves total reflection conditions of light to improve the quantum efficiency.

Furthermore, the nanoscale uneven structure can also reduce the stress and resultant dislocation between the sapphire substrate and the GaN layer originated from the lattice constant mismatch therebetween. This remarkably improves the reliability of the nitride-based semiconductor and an LED adopting the same.

While the present invention has been shown and described in connection with the preferred embodiments, it will be apparent to those skilled in the art that modifications and variations can be made without departing from the spirit and scope of the invention as defined by the appended claims.

What is claimed is:

1. A fabrication method of nitride-based semiconductors comprising the following steps of:
   (a) forming a self-organizing metal layer on a sapphire substrate;
   (b) heating the sapphire substrate having the self-organizing metal layer so that self-organizing metal coalesces into nanoscale clusters to irregularly expose an upper surface of the sapphire substrate;
   (c) plasma etching exposed portions of the sapphire substrate using the self-organized metal clusters as a mask to form a nanoscale uneven structure on the sapphire substrate; and
   (d) wet etching a resultant structure to remove the self-organized metal clusters.

2. The fabrication method of nitride-based semiconductors according to claim 1, wherein the step (a) forms the self-organizing metal layer at a thickness of about 10 to 200 nm.

3. The fabrication method of nitride-based semiconductors according to claim 1, wherein the step (a) forms the self-organizing metal layer at a thickness of about 30 to 100 nm.

4. The fabrication method of nitride-based semiconductors according to claim 1, wherein the step (a) forms the self-organizing metal layer via vapor deposition.

5. The fabrication method of nitride-based semiconductors according to claim 4, wherein the vapor deposition is carried out via electron beam evaporation which generates electron beams at a voltage of about 5 kV and a discharge current of about 2 mA between a filament and a furnace in an electron beam pocket for a time period of about 5 to 10 minutes.

6. The fabrication method of nitride-based semiconductors according to claim 1, wherein the self-organizing metal layer is made of at least one selected from a group including Pt, Au, Cr and alloys thereof.

7. The fabrication method of nitride-based semiconductors according to claim 1, wherein the heating step (b) is carried out at a temperature range of about 500 to 1000° C. in nitrogen atmosphere for about 2 to 10 mins.

8. The fabrication method of nitride-based semiconductors according to claim 1, wherein the heating step (b) is carried out at a temperature range of 700 to 1000° C. in nitrogen atmosphere for about 7 to 10 mins.

9. The fabrication method of nitride-based semiconductors according to claim 1, wherein the etching step (c) is carried out via Inductive Coupled Plasma-Reactive Ion Etching (ICP-RIE).

10. The fabrication method of nitride-based semiconductors according to claim 9, wherein the ICP-RIE is carried out at a high frequency power of about 50 to 100W and a DC bias of about 100 to 300V under a pressure of about 1 to 100 mmTorr for about 5 to 20 min. while injecting HBr or $BCl_3$ at a flow rate of about 1 to 200 cc per min.

11. The fabrication method of nitride-based semiconductors according to claim 1, wherein the etching step (c) forms irregular-shaped pores in the exposed portions on the sapphire substrate, the pores having a width of about 50 to 500 nm and a depth of about 3 to 50 nm.

12. The fabrication method of nitride-based semiconductors according to claim 1, wherein the etching step (c) forms irregular-shaped pores in the exposed portions on the sapphire substrate, the pores having a width of about 50 to 500 nm and a depth of about 5 to 20 nm.

13. The fabrication method of nitride-based semiconductors according to claim 1, wherein the wet etching step (d) comprises: immersing the etched sapphire substrate into aqua regia and heating the aqua regia containing the sapphire substrate at a temperature of about 80 to 90° C. for about 30 secs. to 2 mins.

14. The fabrication method of nitride-based semiconductors according to claim 1, further comprising the step of forming a nitride layer on the sapphire substrate after the wet etching step (d).

15. The fabrication method of nitride-based semiconductors according to claim 1, wherein the sapphire substrate is replaced by one selected from a group including a SiC substrate, an oxide substrate and a carbide substrate.

16. A nitride-based semiconductor comprising:
a sapphire substrate;
a nitride nucleation layer, an n-doped GaN layer, an activation layer and a p-doped GaN layer formed in their order on the sapphire substrate; and
a nanoscale uneven structure formed on the sapphire substrate according to the method described in claim 1.

17. The nitride-based semiconductor according to claim 16, wherein the nanoscale uneven structure includes irregular-shaped pores having a width of about 50 to 500 nm and a depth of about 3 to 50 nm.

18. The nitride-based semiconductor according to claim 16, wherein the nanoscale uneven structure includes irregular-shaped pores having a width of about 50 to 500 nm and a depth of about to 20 nm.

19. The nitride-based semiconductor according to claim 16, wherein the sapphire substrate is replaced by one selected from a group including a SiC substrate, an oxide substrate and a carbide substrate.

20. A nitride-based semiconductor for use with a light emitting diode comprising:
a sapphire substrate;
a nitride nucleation layer, an n-doped GaN layer, an activation layer and a p-doped GaN layer formed in their order on the sapphire substrate; and
an uneven structure of irregular-shaped pores formed on the sapphire substrate, wherein the pores have a width of about 50 to 500 nm and a depth of about 3 to 50 nm.

21. The nitride-based semiconductor according to claim 20, wherein the pores have a width of about 50 to 500 nm and a depth of about 5 to 20 nm.

* * * * *